(12) United States Patent
Zhang

(10) Patent No.: US 11,121,340 B2
(45) Date of Patent: Sep. 14, 2021

(54) ELECTROLUMINESCENT DEVICE, MANUFACTURING METHOD THEREOF, AND DISPLAY APPARATUS

(71) Applicant: BOE Technology Group Co., Ltd., Beijing (CN)

(72) Inventor: Xin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/759,779

(22) PCT Filed: Aug. 19, 2019

(86) PCT No.: PCT/CN2019/101356
§ 371 (c)(1),
(2) Date: Apr. 28, 2020

(87) PCT Pub. No.: WO2020/078099
PCT Pub. Date: Apr. 23, 2020

(65) Prior Publication Data
US 2021/0143356 A1 May 13, 2021

(30) Foreign Application Priority Data
Oct. 19, 2018 (CN) .......................... 201811223778.3

(51) Int. Cl.
*H01L 51/50* (2006.01)
*H01L 51/56* (2006.01)

(52) U.S. Cl.
CPC ........ *H01L 51/5056* (2013.01); *H01L 51/502* (2013.01); *H01L 51/5004* (2013.01);
(Continued)

(58) Field of Classification Search
CPC ............. H01L 51/5056; H01L 51/5004; H01L 51/5008
See application file for complete search history.

(56) References Cited

U.S. PATENT DOCUMENTS
2017/0207407 A1 7/2017 Liao

FOREIGN PATENT DOCUMENTS
| CN | 104795505 A | 7/2015 |
| CN | 105070845 A | 11/2015 |
(Continued)

OTHER PUBLICATIONS

First Office Action, including Search Report, for Chinese Patent Application No. 201811223778.3, dated Sep. 17, 2019, 21 pages.

*Primary Examiner* — Anthony Ho
(74) *Attorney, Agent, or Firm* — Westman, Champlin & Koehler, P.A.

(57) ABSTRACT

An electroluminescent device, a manufacturing method thereof, and a display apparatus are provided. The electroluminescent device includes an anode layer, a light emitting layer, a cathode layer, a hole transport layer located between the anode layer and the light emitting layer, and a electron transport layer located between the cathode layer and the light emitting layer. The electroluminescent device further includes: a first interface modification layer between the light emitting layer and one of the hole transport layer and the electron transport layer; wherein an energy level of the first interface modification layer matches an energy level of the light emitting layer and an energy level of the one of the hole transport layer and the electron transport layer.

20 Claims, 9 Drawing Sheets

(52) U.S. Cl.
CPC ...... *H01L 51/5008* (2013.01); *H01L 51/5072* (2013.01); *H01L 51/56* (2013.01)

(56) References Cited

FOREIGN PATENT DOCUMENTS

| | | |
|---|---|---|
| CN | 105720206 A | 6/2016 |
| CN | 106025069 A | 10/2016 |
| CN | 106450009 A | 2/2017 |
| CN | 106549110 A | 3/2017 |
| CN | 106784349 A | 5/2017 |
| CN | 108258128 A | 7/2018 |
| CN | 109473559 A | 3/2019 |
| KR | 20160082880 A | 7/2016 |

ELECTROLUMINESCENT DEVICE, MANUFACTURING METHOD THEREOF, AND DISPLAY APPARATUS

CROSS-REFERENCE TO RELATED APPLICATION

This application is a Section 371 National Stage Application of International Application No. PCT/CN2019/101356, filed on Aug. 19, 2019, entitled "ELECTROLUMINESCENT DEVICE, MANUFACTURING METHOD THEREOF, AND DISPLAY APPARATUS", which published as WO 2020078099 A1, on Apr. 23, 2020, and claims priority to Chinese Patent Application No. 201811223778.3 filed on Oct. 19, 2018 with the Chinese National Intellectual Property Administration, the disclosures of which are incorporated herein by reference in their entireties.

TECHNICAL FIELD

The present disclosure relates to the field of display technology, and particularly to an electroluminescent device, a manufacturing method thereof, and a display apparatus.

BACKGROUND

Quantum Dot Light Emitting Diodes (QLEDs) have the advantages of such as high brightness, low cost, and ease of mass production, such that it has promising prospect in the application in the next generation of the display apparatus. However, the energy level barrier between the commonly used electron/hole transport layer and the light emitting layer is so high that a high turn-on voltage of the device is resulted.

SUMMARY

An embodiment of the present disclosure provides an electroluminescent device, including an anode layer, a light emitting layer, a cathode layer, a hole transport layer between the anode layer and the light emitting layer, and an electron transport layer between the cathode layer and the light emitting layer, wherein the electroluminescent device further includes: a first interface modification layer between the light emitting layer and one of the hole transport layer and the electron transport layer; wherein an energy level of the first interface modification layer matches an energy level of the light emitting layer and an energy level of the one of the hole transport layer and the electron transport layer.

In some embodiments, the electroluminescent device further includes: a second interface modification layer between the light emitting layer and the other one of the hole transport layer and the electron transport layer; wherein an energy level of the second interface modification layer matches an energy level of the light emitting layer and an energy level of the other one of the hole transport layer and the electron transport layer.

In some embodiments, the first interface modification layer is located between the electron transport layer and the light emitting layer, and the highest occupied molecular orbital energy level of the first interface modification layer is between the highest occupied molecular orbital energy level of the electron transport layer and the highest occupied molecular orbital energy level of the light emitting layer; and the second interface modification layer is located between the hole transport layer and the light emitting layer, and the lowest unoccupied molecular orbital energy level of the second interface modification layer is between the lowest unoccupied molecular orbital energy level of the hole transport layer and the lowest unoccupied molecular orbital energy level of the light emitting layer.

In some embodiments, the first interface modification layer includes a quantum dot film or a perovskite polycrystalline film; and the second interface modification layer includes a quantum dot film or a perovskite polycrystalline film.

In some embodiments, quantum dots in the quantum dot film have a size between 2 nm and 20 nm; crystalline grains in the perovskite polycrystalline film have a size of 2 nm to 1000 nm.

In some embodiments, the quantum dot film includes at least one of the following quantum dots: quantum dots composed of Group II elements and Group VI elements; quantum dots composed of Group III elements and Group V elements; quantum dots composed of Group I elements, Group III elements, and Group V elements; quantum dots composed of Group I elements, Group III elements, and Group VI elements; or quantum dots composed of Group II elements, Group IV elements and Group VI elements.

In some embodiments, the first interface modification layer includes quantum dots composed of copper indium sulfur and zinc sulfide, or quantum dots composed of cadmium selenide and zinc sulfide; and the second interface modification layer includes quantum dots composed of copper indium sulfur and zinc sulfide, or quantum dots composed of cadmium selenide and zinc sulfide.

In some embodiments, the quantum dot film includes $ABX_3$ type quantum dots, wherein A is an organic amine cation, B is a divalent metal cation, and X is a halogen anion.

In some embodiments, each of the first interface modification layer and the second interface modification layer has thickness between 10 nm and 1000 nm.

In some embodiments, the first interface modification layer is located between the electron transport layer and the light emitting layer, and the lowest unoccupied molecular orbital energy level of the first interface modification layer is between the lowest unoccupied molecular orbital energy level of the electron transport layer and the lowest unoccupied molecular orbital energy level of the light emitting layer, wherein, the hole transport layer includes a first hole transport layer and a second hole transport layer; the first hole transport layer is located between the second hole transport layer and the anode layer; the first hole transport layer is made of a mixture of a poly 3,4-ethylenedioxythiophene monomer and a polystyrene sulfonate; the second hole transport layer is made of TFB; the first interface modification layer includes blue light perovskite quantum dots; the anode layer is made of indium tin oxide; the light emitting layer includes green light perovskite quantum dots; the electron transport layer is made of TPBi; and the cathode layer is made of Al.

In some embodiments, the hole transport layer includes a first hole transport layer and a second hole transport layer; the first hole transport layer is located between the second hole transport layer and the anode layer; the first hole transport layer is made of a mixture of a poly 3,4-ethylenedioxythiophene monomer and a polystyrene sulfonate; the second hole transport layer is made of TFB; the first interface modification layer includes quantum dots composed of cadmium selenide and zinc sulfide; the second interface modification layer includes quantum dots composed of copper indium sulfur and zinc sulfide; the anode layer is made of indium tin oxide; the light emitting layer is made of green light perovskite film; the electron transport layer is made of TPBi; and the cathode layer is made of Al.

In some embodiments, the electroluminescent device further includes an electrode modification layer which is located between the electron transport layer and the cathode layer.

In some embodiments, the electrode modification layer includes lithium fluoride and a thickness of the electrode modification layer is between 1 nm and 10 nm.

An embodiment of the present disclosure also provides a display apparatus including the electroluminescent device as described in any one of the above embodiments.

An embodiment of the present disclosure also provides a manufacturing method for an electroluminescent device, the manufacturing method including: fabricating an anode layer on a base substrate; fabricating a hole transport layer on a side of the anode layer that is opposite to the base substrate; fabricating a light emitting layer on a side of the hole transport layer that is opposite to the base substrate; fabricating an electron transport layer on a side of the light emitting layer that is opposite to the base substrate; and fabricating a cathode layer on a side of the electron transport layer that is opposite to the base substrate, wherein, the method further includes: after fabricating the hole transport layer and before fabricating the light emitting layer, forming a second interface modification layer on a side of the hole transport layer that is opposite to the base substrate, and an energy level of the second interface modification layer matches an energy level of the hole transport layer and an energy level of the light emitting layer; and/or after fabricating the light emitting layer and before fabricating the electron transport layer, forming a first interface modification layer on a side of the light emitting layer that is opposite to the base substrate, and an energy level of the first interface modification layer matches an energy level of the electron transport layer and an energy level of the light emitting layer.

In some embodiments, the first interface modification layer includes a quantum dot film or a perovskite polycrystalline film; the second interface modification layer includes a quantum dot film or a perovskite polycrystalline film.

In some embodiments, forming a second interface modification layer on a side of the hole transport layer that is opposite to the base substrate includes: preparing a precursor solution containing an organic amine cations, divalent metal cations, and halogen anions; adding the precursor solution into a solution containing an organic ligand, removing a top layer of solution and then centrifuging the solution to obtain perovskite quantum dots containing powders; dissolving the perovskite quantum dots containing powders in a non-polar organic solvent, centrifuging the solvent in which the perovskite quantum dots containing powders are dissolved and taking supernatant to filter so as to obtain a perovskite quantum dots containing solution; and spin-coating the obtained perovskite quantum dots containing solution on the hole transport layer; and/or wherein, forming a first interface modification layer on a side of the light emitting layer that is opposite to the base substrate includes: preparing a precursor solution containing organic amine cations, divalent metal cations, and halogen anions; adding the precursor solution into a solution containing an organic ligand, removing a top layer of solution and then centrifuging the solution to obtain perovskite quantum dots containing powders; dissolving the perovskite quantum dots containing powders in a non-polar organic solvent, centrifuging the solvent in which the perovskite quantum dots containing powders are dissolved and taking supernatant to filter so as to obtain a perovskite quantum dots containing solution; and spin-coating the obtained perovskite quantum dots containing solution on the light emitting layer.

In some embodiments, forming a second interface modification layer on a side of the hole transport layer that is opposite to the base substrate includes: preparing a precursor solution containing organic amine cations, divalent metal cations, and halogen anions; and spin-coating the precursor solution on the hole transport layer; and/or wherein, forming a first interface modification layer on a side of the light emitting layer that is opposite to the base substrate includes: preparing a precursor solution containing organic amine cations, divalent metal cations, and halogen anions; and spin-coating the precursor solution on the light emitting layer.

In some embodiments, forming a second interface modification layer on a side of the hole transport layer that is opposite to the base substrate includes: taking nanoparticles having a predetermined light-emitting peak and then dissolving the nanoparticles in a non-polar organic solvent to obtain a quantum dots containing solution; and filtering the obtained quantum dots containing solution and spin-coating it on the hole transport layer; and/or wherein, forming a first interface modification layer on a side of the light emitting layer that is opposite to the base substrate includes: taking nanoparticles having a predetermined light-emitting peak and then dissolving the nanoparticles in a non-polar organic solvent to obtain a quantum dots containing solution; and filtering the obtained quantum dots containing solution and spin-coating it on the light emitting layer.

BRIEF DESCRIPTION OF THE DRAWINGS

The above and/or additional aspects and advantages of the present disclosure will become apparent and easily understood from the following description of the embodiments in conjunction with the accompanying drawings, in which.

DETAILED DESCRIPTION OF EMBODIMENTS

Figure 1:
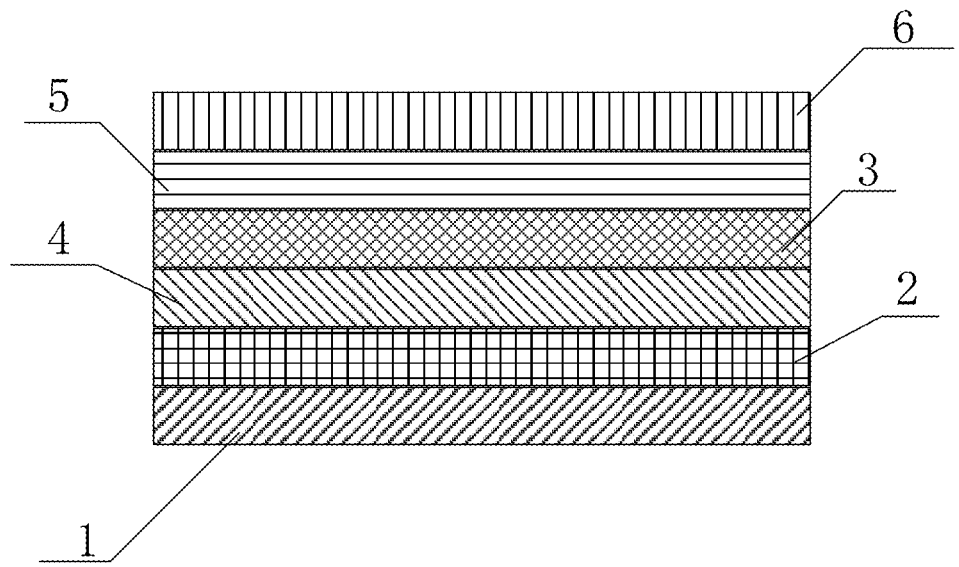
FIG. 1 schematically shows the structure of some embodiments of the electroluminescent device according to the present application.

Hereinafter, embodiments of the present disclosure will be described in detail. Examples of the embodiments are shown in the accompanying drawings, wherein the same or similar reference numerals represent the same or similar elements or the elements having the same or similar functions throughout. The embodiments described below with reference to the drawings are exemplary, and are only used to explain the present disclosure, but cannot be considered as limiting the present disclosure.

Those skilled in the art will understand that, unless specifically stated otherwise, the singular form represented by "a", "an", "said" and "the" may include plural form. It should be further understood that the wording "include/comprise" used in the specification of the present disclosure refers to the presence of the described features, integers, steps, operations, elements and/or components, but does not exclude the presence or addition of one or more other features, integers, steps, operations, elements, components, and/or groups thereof. It is understood that if an element is referred to as being "connected" to another element, it can be directly connected to the other element or intervening elements may also be present. In addition, "connection" as used herein may include wireless connection. As used herein, the term "and/or" includes all or any of the elements and all combinations of one or more of the associated listed items.

It will be understood by those skilled in the art that, unless otherwise defined, all terms (including technical and scientific terms) used herein have the same meaning as commonly understood by one of ordinary skill in the art to which this disclosure belongs. It should also be understood that terms such as those defined in the general dictionary should be understood to have meanings consistent with the meanings in the context of the prior art, and unless specifically defined like this, they would not be explained as idealized or overly formal meaning.

In order to reduce the turn-on voltage of the device and improve its efficiency, an embodiment of the present disclosure provides an electroluminescent device including an anode layer, a light emitting layer, a cathode layer, a hole transport layer between the anode layer and the light emitting layer, and an electron transport layer between the cathode layer and the light emitting layer. The electroluminescent device further includes: a first interface modification layer located at the electron transport layer and the light emitting layer; and/or a second interface modification layer located between the hole transport layer and the light emitting layer; wherein, the energy level of the second interface modification layer matches the energy level of the hole transport layer and the energy level of the light emitting layer; the energy level of the first interface modification layer matches the energy level of the electron transport layer and the energy level of the light emitting layer.

In some embodiments of the present disclosure, a first interface modification layer is provided between the light emitting layer and the electron transport layer, and/or a second interface modification layer is provided between the light emitting layer and the hole transport layer. The energy level of the second modification layer matches the energy level of the hole transport layer and the energy level of the light emitting layer, and the energy level of the first interface modification layer matches the energy level of the electron transport layer and the energy level of the light emitting layer, such that the electron and/or hole injection barrier could be reduced, thereby reducing the turn-on voltage of the device and improving its efficiency.

It is understood that the first interface modification layer and the second interface modification layer are only intended for distinguishing them, but do not have a special limiting effect. That is, the first interface modification layer may refer to the interface modification layer that is provided between the light emitting layer and one of the hole transport layer and the electron transport layer, while the second interface modification layer may refer to the interface modification layer that is provided between the light emitting layer and the other one of the hole transport layer and the electron transport layer. For convenience of description, in the following embodiments, a description is made by taking the following arrangement as example: the first interface modification layer is between the light emitting layer and the electron transport layer and the second interface modification layer is between the light emitting layer and the hole transport layer.

Specifically, FIG. 1 schematically shows the structure of the electroluminescent device according to some embodiments of the present application. As shown in FIG. 1, the electroluminescent device includes an anode layer 1, a light emitting layer 4, a cathode layer 6, a hole transport layer 2 between the anode layer 1 and the light emitting layer 4, and an electron transport layer 5 between the cathode layer 6 and the light emitting layer 4. The electroluminescent device further includes a first interface modification layer 3 located between the electron transport layer 5 and the light emitting layer 4.

In some embodiments, the first interface modification layer 3 includes a quantum dot film or a perovskite polycrystalline film. For example, the size of the quantum dots in the quantum dot film is from 2 nm to 20 nm, and the size of the crystalline grain in the perovskite polycrystalline film is from 2 nm to 1000 nm.

In some embodiments, the quantum dot film includes at least one of the following quantum dots: the quantum dot composed of Group II (e.g., Group IIB) elements and Group VI (e.g., Group VIA) elements; the quantum dot composed of Group III (e.g., Group IIIA) elements and Group V (e.g., Group VA) elements; the quantum dot composed of Group I (e.g., Group IB) elements, Group III (e.g., Group IIIA) elements, or Group V (e.g., Group VA) elements; the quantum dot composed of Group I (e.g., Group IB) elements, Group III (e.g., Group IIIA) elements, and Group VI (e.g., Group VIA) elements; or the quantum dot composed of Group II (e.g., Group IIB) elements, Group IV (e.g., Group IVA) elements, and Group VI (e.g., Group VIA) elements.

In some embodiments, the quantum dot film includes $ABX_3$ type quantum dots, where A is an organic amine cation, B is a divalent metal cation, and X is a halogen anion.

For example, the first interface modification layer 3 includes quantum dots composed of copper indium sulfur and zinc sulfide, or quantum dots composed of cadmium selenide and zinc sulfide.

Figure 2:
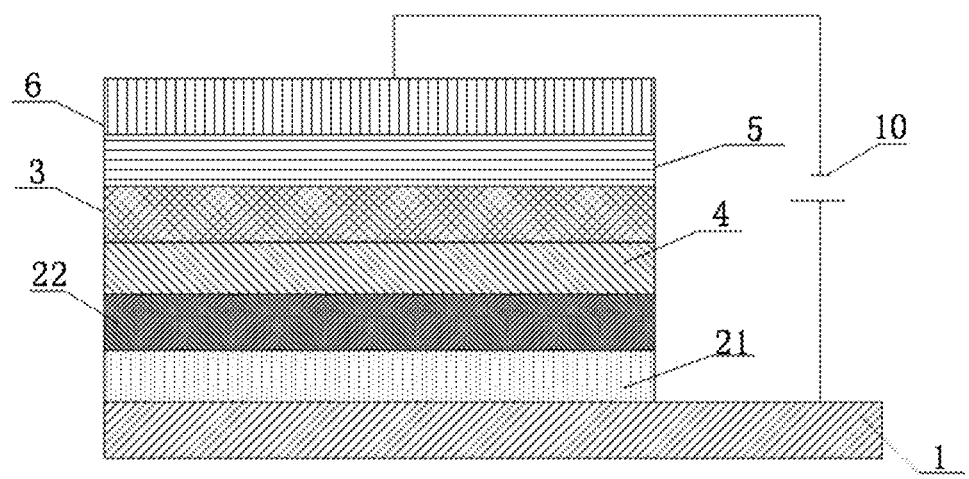
FIG. 2 schematically shows the structure of the electroluminescent device in FIG. 1 connected to a power source.

FIG. 2 schematically shows the structure of the electroluminescent device in FIG. 1 connected to a power source. The anode layer 1 and the cathode layer 6 are connected to a power source 10, which provides current to the electroluminescent device. The hole transport layer 2 includes a first hole transport layer 21 and a second hole transport layer 22. The first hole transport layer 21 is made of a mixture (PEDOT: PSS) of poly3,4-ethylenedioxythiophene monomer and polystyrene sulfonate. The second hole transport layer 22 is made of TFB (Poly[(9,9-dioctylfluoren-2,7-diyl)-alt-(4,4'-(N-(4-butyl)phenyl)-diphenylamine).

Figure 3:
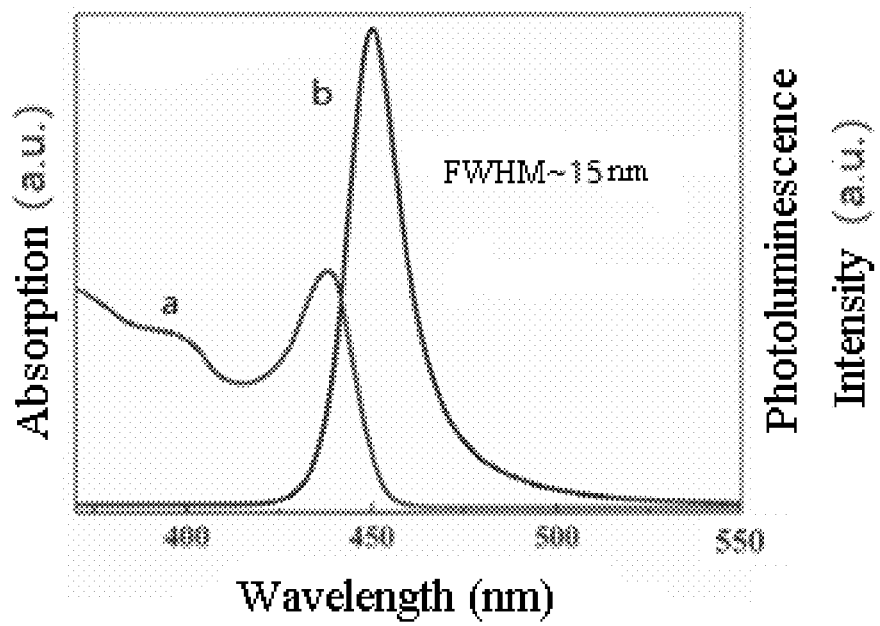
FIG. 3 schematically shows the UV(ultraviolet) absorption spectrum and the fluorescence emission spectrum of the blue light $MAPbBr_3$ quantum dots.

As shown in FIG. 2, the first interface modification layer 3 includes, for example, blue light emitting perovskite (hereinafter referred to as: blue light $MAPbBr_3$) quantum dots, where MA represents Methylamine FIG. 3 shows the UV absorption spectrum (indicated by curve a) and the fluorescence emission spectrum (indicated by curve b) of the blue MAPbBr3 quantum dots. As shown in FIG. 3, the peak of the blue light MAPbBr3 quantum dot in the emission spectrum is located at 455 nm with a FWHM (full width at half maximum) of 15 nm.

As shown in FIG. 2, the anode layer 1 includes for example indium tin oxide (ITO), the light emitting layer 4 includes for example green light $MAPbBr_3$ quantum dots, the electron transport layer 5 includes for example 1,3,5-tris (1-phenyl-1H-benzimidazol-2-yl) benzene (TPBi), and the cathode layer 6 includes for example aluminum (Al).

Figure 4:
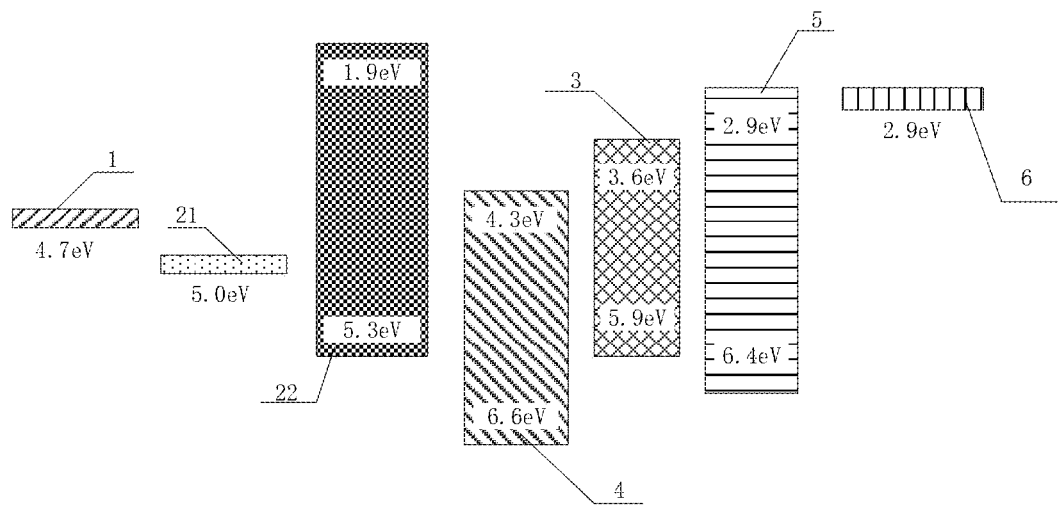
FIG. 4 schematically shows the energy level diagram of the electroluminescent device in FIG. 2.

The energy level matching, for example, means that the electron and/or hole injection barrier value of the interface modification layer falls within a reasonable range between the electron and/or hole injection barrier values of two layers adjacent to the interface modification layer. Specifically, FIG. 4 shows the energy level diagram of the electroluminescent device of FIG. 2, which shows the highest occupied molecular orbital energy level and the lowest unoccupied molecular orbital energy level of each layer. In the absence of the first interface modification layer 3, the electron injection barrier between the light emitting layer 4 and the electron transport layer 5 (that is, the difference between the lowest unoccupied molecular orbital energy level of the light emitting layer 4 and the lowest unoccupied molecular orbital energy level of the electron transport layer 5) (4.3 eV-2.9 eV) is 1.4 eV. However, after the first interface modification layer 3 is provided between the light emitting layer 4 and the electron transport layer 5, the electron injection barrier between the light emitting layer 4 and the first interface modification layer 3 (that is, the difference between the lowest unoccupied molecular orbital energy level of the light emitting layer 4 and the lowest unoccupied molecular orbital energy level of the first interface modification layer 3) (4.3 eV-3.6 eV) is reduced to 0.7 eV. Therefore, by providing the first interface modification layer 3 according to the embodiments of the present application in the electroluminescent device, the electron injection barrier is reduced from 1.4 eV to 0.7 eV. Therefore, the lowest unoccupied molecular orbital energy level of the first interface modification layer 3 should be between the lowest unoccupied molecular orbital energy level of the light emitting layer 4 and the lowest unoccupied molecular orbital energy level of the electron transport layer 5, so as to obtain technical effects of reducing turn-on voltage and improving device efficiency.

Similarly, when the second interface modification layer 7 is provided between the light emitting layer 4 and the hole transport layer 2, the highest occupied molecular orbital energy level of the second interface modification layer 7 should be between the highest occupied molecular orbital energy level of the light emitting layer 4 and the highest occupied molecular orbital energy level of the hole transport layer 2, so as to also obtain the technical effects of reducing turn-on voltage and improving device efficiency.

In some embodiments, the second interface modification layer 7 and/or the first interface modification layer 3 may be made of a single layer, or may include multiple sub-layers.

Figure 5A:
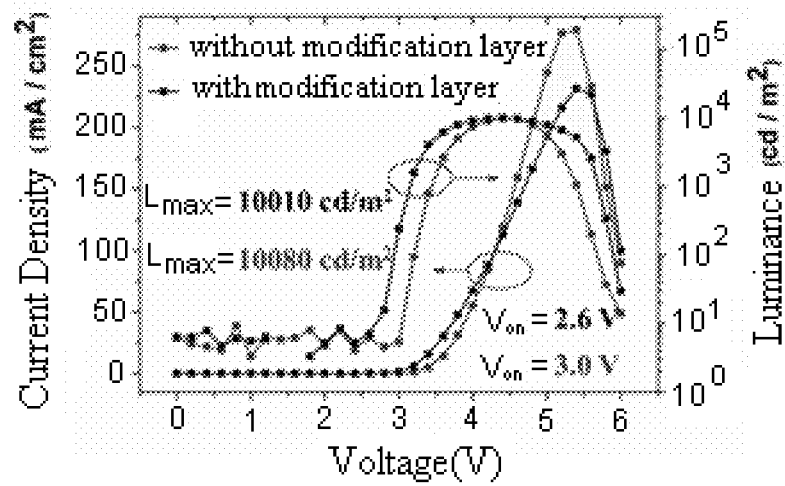
FIG. 5A illustrates the lines showing the current density of the electroluminescent device as a function of voltage and the lines showing the brightness of the electroluminescent device as a function of voltage with and without the interface modification layer in FIG. 2.
Figure 5B:
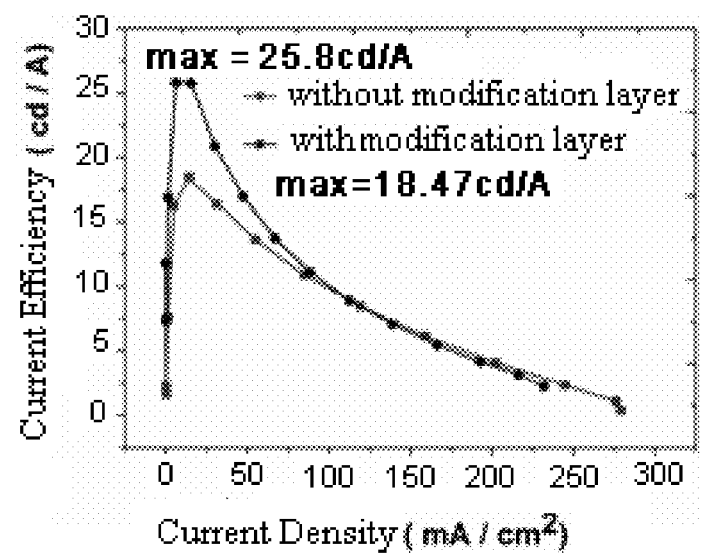
FIG. 5B illustrates the lines showing the current efficiency of the electroluminescent device as a function of the current density with and without the interface modification layer in FIG. 2.

Further, as shown in FIG. 5A and FIG. 5B, the arrow pointing to the right in FIG. 5A represents the changing of lines showing the brightness of the electroluminescent device as a function of voltage; and the arrow pointing to the left represents the changing of lines showing the current density of the electroluminescent device as a function of voltage. It can be seen that, after the first interface modification layer 3 as disclosed in the embodiment of the present application is provided, the turn-on voltage of the electroluminescent device is reduced from 3V to 2.6V. The maximum current efficiency of the electroluminescent device in FIG. 5B increases from 18.29 cd/A to 21.01 cd/A. Therefore, through the arrangement of the first interface modification layer 3, the turn-on voltage of the electroluminescent device is reduced, and the current efficiency and working efficiency are further improved.

Figure 6:
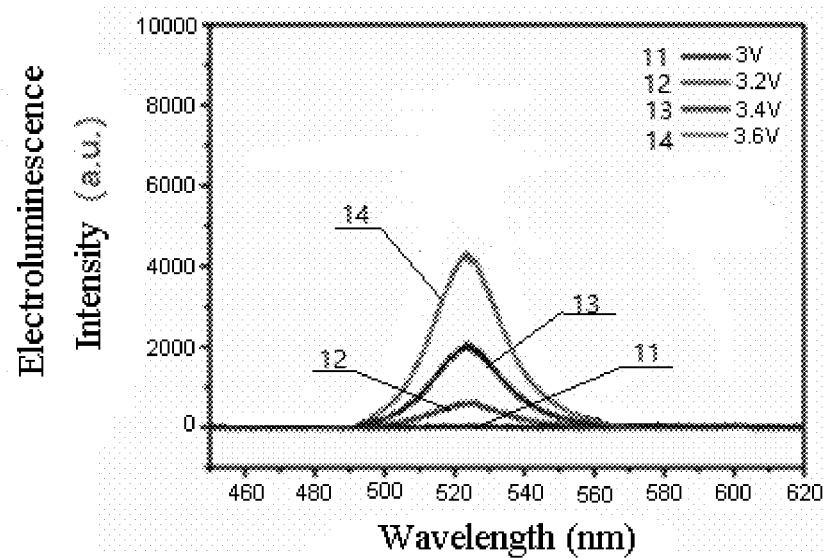
FIG. 6 is an electroluminescence spectrum of the electroluminescent device in FIG. 2 under different loading voltages.

FIG. 6 shows electroluminescent spectra of the electroluminescent device in FIG. 2 under different loading voltages. The reference numeral 11 indicates the electroluminescent spectrum of the electroluminescent device under a voltage of 3 V. The reference numeral 12 indicates the electroluminescent spectrum of the electroluminescent device under a voltage of 3.2 V. The reference numeral 13 indicates the electroluminescent spectrum of the electroluminescent device under a voltage of 3.4 V. The reference numeral 14 indicates the electroluminescent spectrum of the electroluminescent device under a voltage of 3.6 V. As shown in FIG. 6, after the interface modification layer including blue light $MAPbBr_3$ quantum dots is added, the light emission peak of the device is located at 525 nm, and there is no parasitic light emission from the second hole transport layer 22 or the quantum dots of the first interface modification layer 3.

Figure 7:
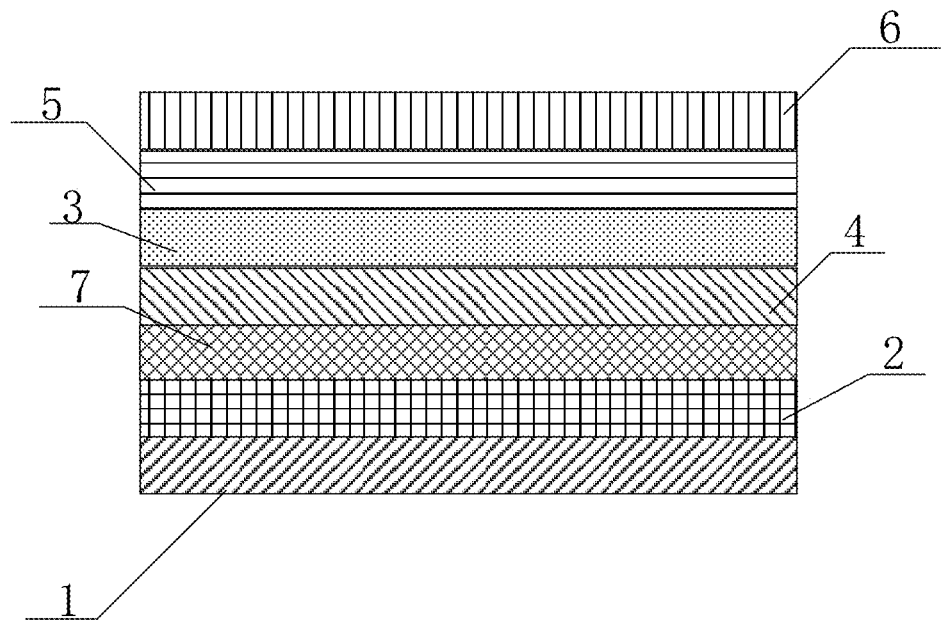
FIG. 7 schematically shows the structure of some other embodiments of the electroluminescent device according to the present disclosure.

Like the electroluminescent device of the embodiment shown in FIG. 1 to FIG. 6, FIG. 7 to FIG. 10B show an electroluminescent device of another embodiment of the present application respectively. As shown in FIG. 7, the electroluminescent device includes an anode layer 1, a light emitting layer 4, a cathode layer 6, a hole transport layer 2 between the anode layer 1 and the light emitting layer 4, and an electron transport layer 5 between the cathode layer 6 and the light emitting layer 4. The electroluminescent device further includes: a second interface modification layer 7 located between the hole transport layer 2 and the light emitting layer 4; and a first interface modification layer 3 located between the electron transport layer 5 and the light emitting layer 4. Each of the second interface modification layer 7 and the first interface modification layer 3 includes a quantum dot film or a perovskite polycrystalline film.

Like the electroluminescent device of the foregoing embodiment of the present disclosure, for example, the size of the quantum dots in the quantum dot film in the second interface modification layer 7 is from 2 nm to 20 nm, and the size of the crystalline grain in the perovskite polycrystalline film is from 2 nm to 1000 nm.

In some embodiments, the quantum dot film includes at least one of the following quantum dots: the quantum dot composed of Group II elements and Group VI elements; the quantum dots composed of Group III elements and Group V elements; the quantum dots composed of Group I elements, Group III elements, and Group V elements; the quantum dots composed of Group I elements, Group III elements, and Group VI elements; or the quantum dots composed of Group II elements, Group IV elements, and Group VI elements.

In another embodiment, the quantum dot film includes $ABX_3$ type quantum dots, where A is an organic amine cation, B is a divalent metal cation, and X is a halogen Anion.

In some embodiments, the second interface modification layer 7 includes quantum dots composed of copper indium sulfur and zinc sulfide, or quantum dots composed of cadmium selenide and zinc sulfide. The first interface modification layer 3 includes quantum dots composed of copper indium sulfur and zinc sulfide, or quantum dots composed of cadmium selenide and zinc sulfide.

In the embodiment of the present disclosure, a quantum dot composed of copper indium sulfur and zinc sulfide may have a core-shell structure, with the copper indium sulfur as the core of the quantum dot and the zinc sulfide as the shell of the quantum dot. They may collectively form a quantum dot. Similarly, in the embodiment of the present disclosure, a quantum dot composed of cadmium selenide and zinc sulfide may also have a core-shell structure, with the cadmium selenide as the core of the quantum dot and the zinc sulfide as the shell of the quantum dot. They may also collectively form a quantum dot.

In some embodiments, the second interface modification layer 7 and the first interface modification layer 3 are made of the same material. The second interface modification layer 7 and the first interface modification layer 3 have the same thickness.

In some embodiments, the thicknesses of the first interface modification layer 3 and the second interface modification layer 7 may be in a range of 10 nm to 1000 nm.

Figure 8:
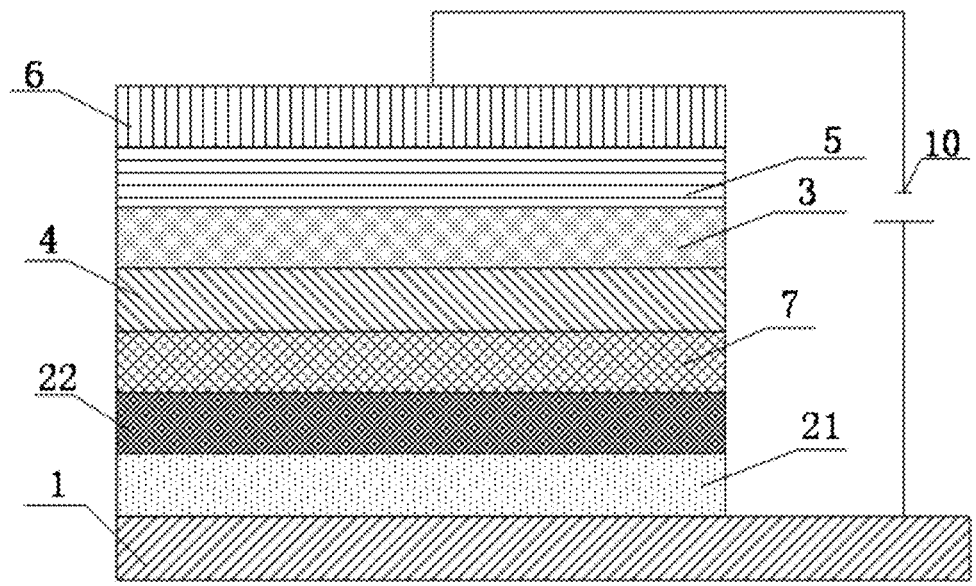
FIG. 8 schematically shows the structure of the electroluminescent device in FIG. 1 connected to a power source.

FIG. 8 schematically shows the structure of the electroluminescent device in FIG. 7 connected to a power source. The hole transport layer 2 includes a first hole transport layer 21 and a second hole transport layer 22. The first hole transport layer 21 is made of a mixture (PEDOT: PSS) of poly3,4-ethylenedioxythiophene monomer and polystyrene sulfonate. The second hole transport layer 22 is made of TFB.

As shown in FIG. 8, the second interface modification layer 7 includes for example quantum dots composed of copper indium sulfur and zinc sulfide. The first interface modification layer 3 includes for example quantum dots composed of cadmium selenide and zinc sulfide. The anode layer 1 includes for example ITO. The light emitting layer 4 includes for example a green light perovskite film. The electron transport layer 5 includes for example TPBi. The cathode layer 6 includes for example Al.

Figure 9:
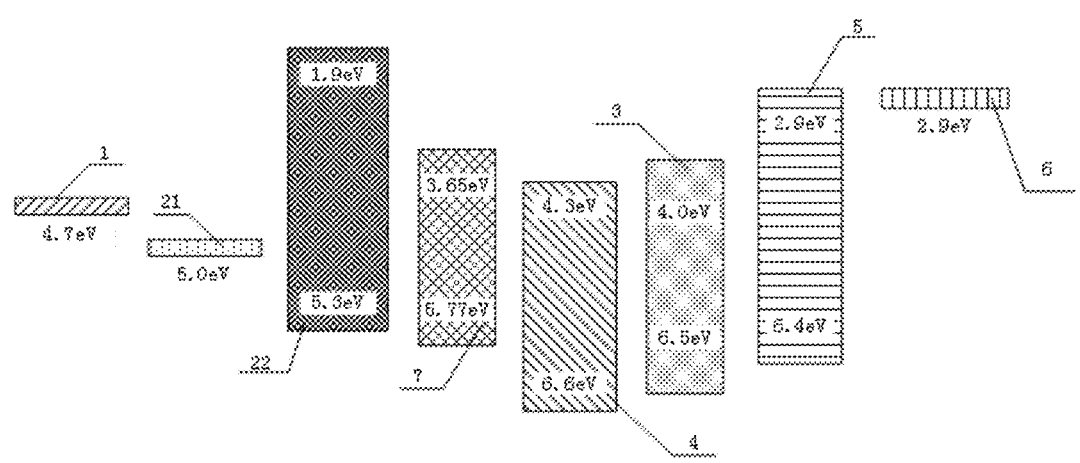
FIG. 9 schematically shows the energy level diagram of the electroluminescent device in FIG. 8.

FIG. 9 shows an energy level diagram of the electroluminescent device of FIG. 8. In the absence of the first interface modification layer 3, the electron injection barrier (4.3 eV-2.9 eV) is 1.4 eV. After the first interface modification layer 3 is added, the electron injection barrier (4.3 eV-4.0 eV) is 0.3 eV. Therefore, after the electroluminescent device is provided with the first interface modification layer 3 as disclosed in the embodiment of this application, the electron injection barrier is reduced from 1.4 eV to 0.3 eV.

As shown in FIG. 9, in the absence of second interface modification layer 7, the hole injection barrier (6.6 eV-5.3 eV) is 1.3 eV. After the second interface modification layer 7 is added, the hole injection barrier (6.6 eV-5.77 eV) is 0.83 eV. Therefore, after the electroluminescent device is provided with the second interface modification layer 7 as disclosed in the embodiment of the present application, the hole injection barrier is reduced from 1.3 eV to 0.83 eV.

Figure 10A:
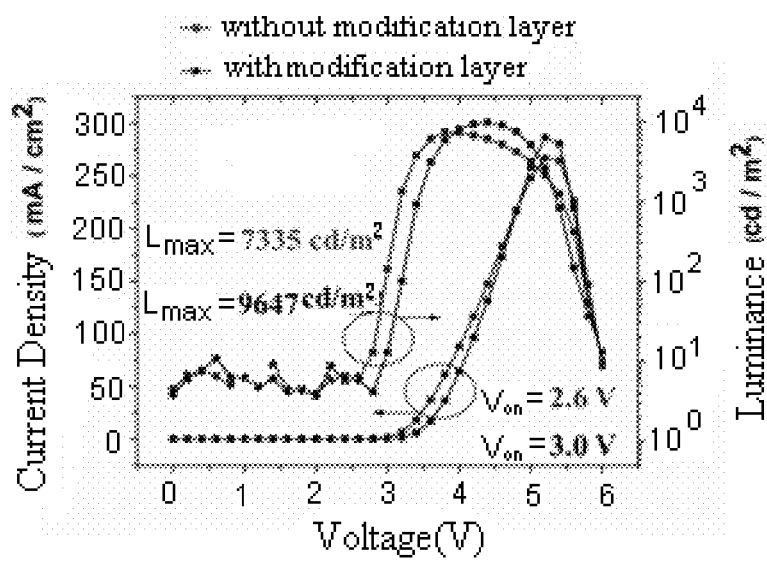
FIG. 10A illustrates the lines showing the current density of the electroluminescent device as a function of voltage and the lines showing the brightness of the electroluminescent device as a function of voltage with and without the interface modification layer in FIG. 7.
Figure 10B:
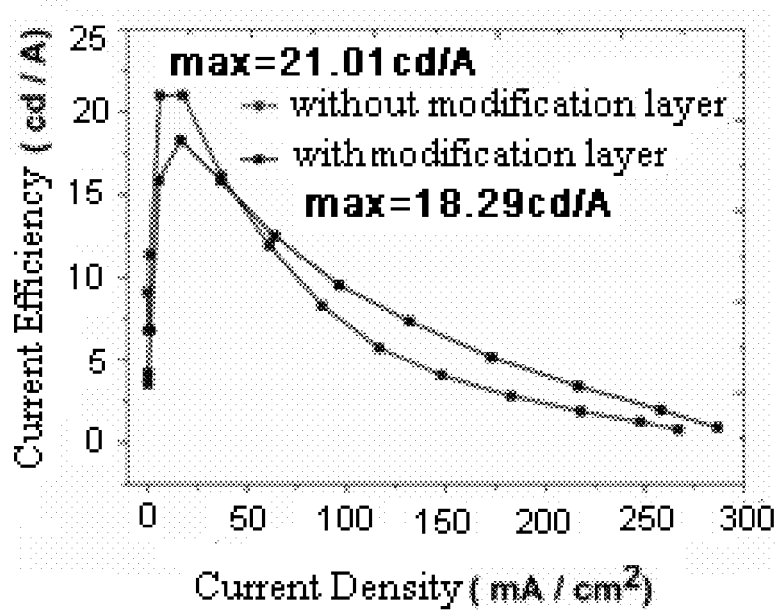
FIG. 10B illustrates the lines showing the current efficiency of the electroluminescent device as a function of the current density with and without the interface modification layer in FIG. 7.

As shown in FIG. 10A and FIG. 10B, after the first interface modification layer 3 and the second interface modification layer 7 as disclosed in the embodiment of the present application are provided, the turn-on voltage of the electroluminescent device is reduced from 3V to 2.6 V, and the maximum current efficiency of the electroluminescent device is increased from 18.47 cd/A to 25.8 cd/A. Therefore, through the arrangement of the first interface modification layer 3 and the second interface modification layer 7, the turn-on voltage of the electroluminescent device is reduced, and the current efficiency and working efficiency are further improved.

In some embodiments, the above electroluminescent device further includes an electrode modification layer 33. The electrode modification layer 33 is located between the electron transport layer 5 and the cathode layer 6. The electrode modification layer 33 functions to reduce the electron injection barrier. For example, the electrode modification layer includes lithium fluoride (LiF). In some embodiments, the thickness of the electrode modification layer 33 may be between 1 nm and 10 nm.

Figure 11:
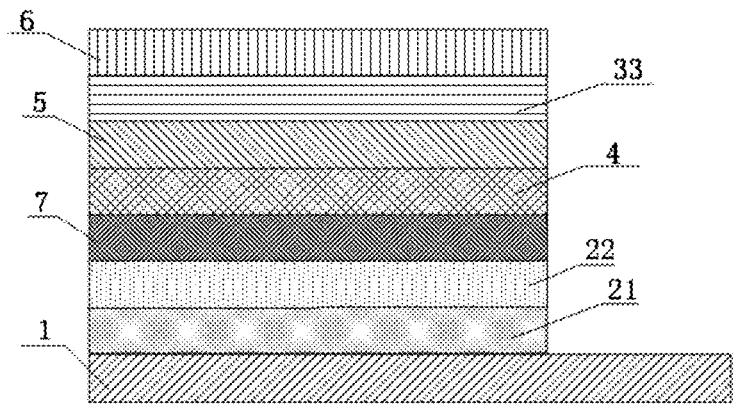
FIG. 11 schematically shows the structure of some other embodiments of the electroluminescent device according to the present disclosure.

In addition, in another embodiment of the present disclosure, only the second interface modification layer 7 is provided, without the first interface modification layer 3, as shown in FIG. 11. FIG. 11 shows a second interface modification layer 7 provided between the light emitting layer 4 and the second hole transport layer 22. This embodiment is similar to the above-mentioned embodiment, and its details will be omitted here. In addition, FIG. 11 shows the above-mentioned electrode modification layer 33 located between the electron transport layer 5 and the cathode layer 6. The electroluminescent device in the embodiment of the present disclosure may be a quantum dot light emitting diode, but is not limited thereto.

Embodiments of the present disclosure also provide a display apparatus including the electroluminescent device according to any one of the above embodiments.

In the embodiment of the present application, an interface modification layer is provided between the light emitting layer and the electron transport layer and/or between the light emitting layer and the hole transport layer, such that the electron injection barrier and/or hole injection barrier can be reduced, thereby reducing the turn-on voltage of the device and improving the device efficiency.

Figure 12:
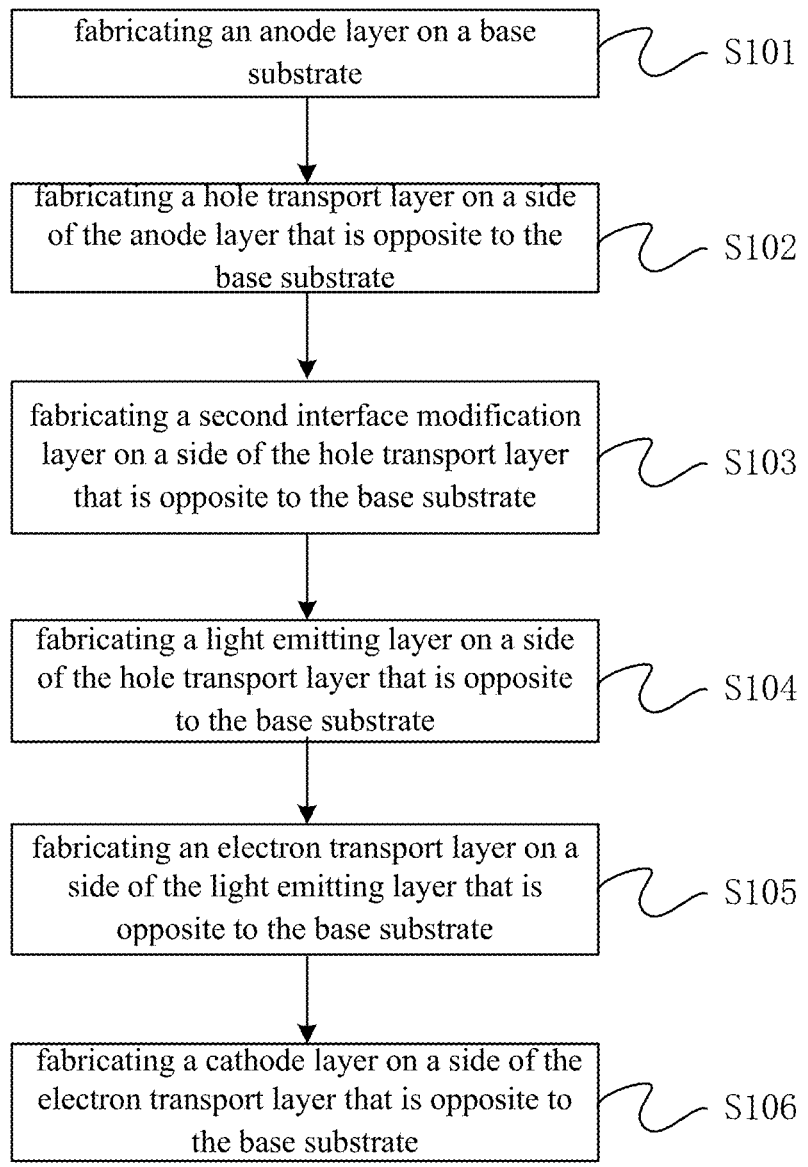
FIG. 12 is a flowchart of a method for manufacturing an electroluminescent device according to some embodiments of the present disclosure.

Embodiments of the present disclosure also provide a method for manufacturing an electroluminescent device. FIG. 12 shows an exemplary flowchart of a method for manufacturing an electroluminescent device according to an embodiment of the present application. As shown in FIG. 12, the method for manufacturing an electroluminescent device includes:

S101: fabricating an anode layer on a base substrate;

S102: fabricating a hole transport layer on a side of the anode layer that is opposite to the base substrate;

S103: fabricating a second interface modification layer on a side of the hole transport layer that is opposite to the base substrate;

S104: fabricating a light emitting layer on a side of the hole transport layer that is opposite to the base substrate;

S105: fabricating an electron transport layer on a side of the light emitting layer that is opposite to the base substrate; and S106: fabricating a cathode layer on a side of the electron transport layer that is opposite to the base substrate.

Figure 13:
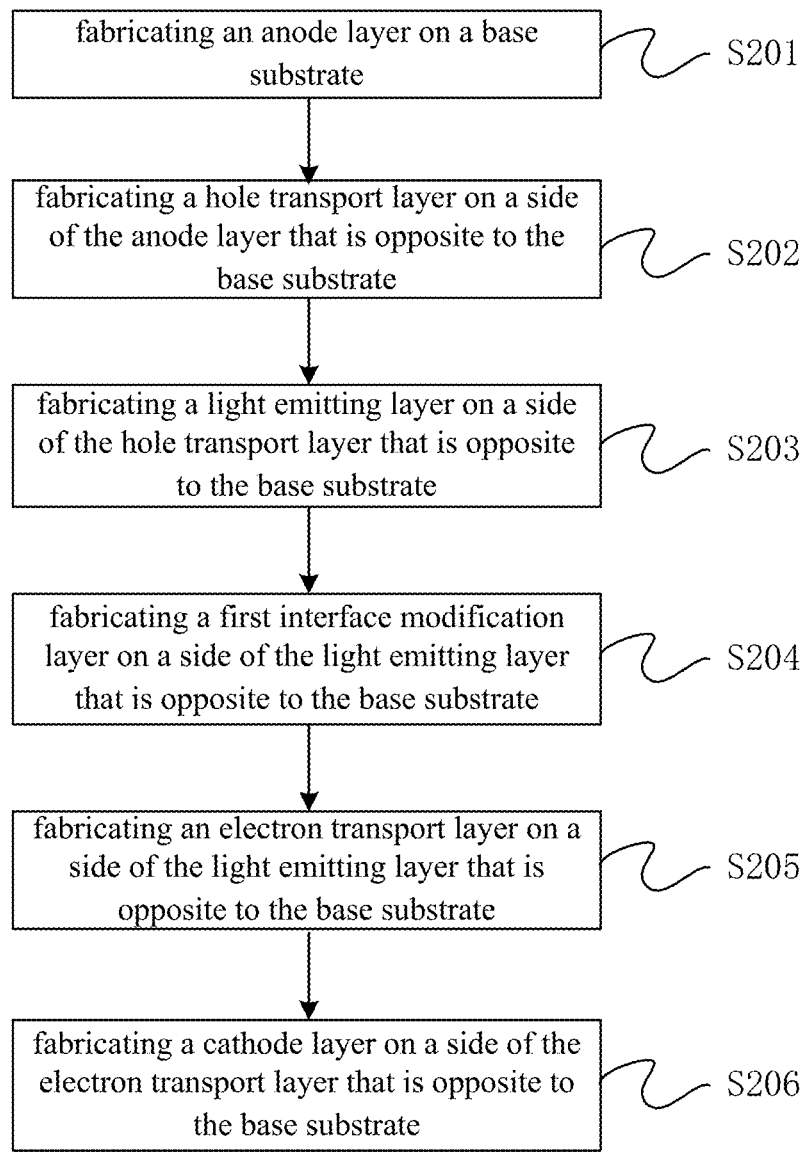
FIG. 13 is a flowchart of the method for manufacturing an electroluminescent device according to some embodiments of the present disclosure.

FIG. 13 shows another exemplary flowchart of a method of manufacturing an electroluminescent device according to an embodiment of the present disclosure. The method includes:

S201: fabricating an anode layer on a base substrate;

S202: fabricating a hole transport layer on a side of the anode layer that is opposite to the base substrate;

S203: fabricating a light emitting layer on a side of the hole transport layer that is opposite to the base substrate;

S204: fabricating a first interface modification layer on a side of the light emitting layer that is opposite to the base substrate;

S205: fabricating an electron transport layer on a side of the light emitting layer that is opposite to the base substrate; and S206: fabricating a cathode layer on a side of the electron transport layer that is opposite to the base substrate.

Figure 14:
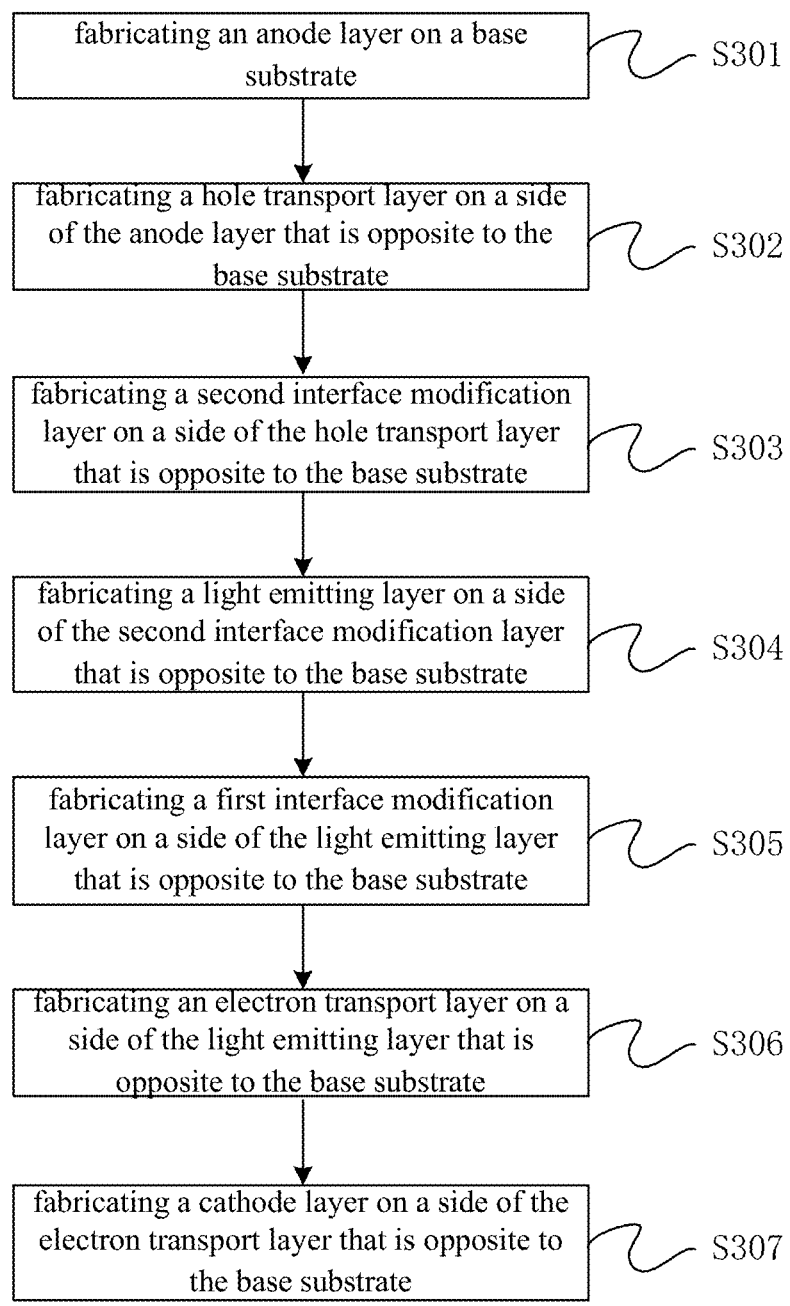
FIG. 14 is a flowchart of the method for manufacturing an electroluminescent device according to still other embodiments of the present disclosure.

FIG. 14 shows another exemplary flowchart of a method of manufacturing an electroluminescent device according to another embodiment of the present disclosure. The method includes:

S301: fabricating an anode layer on a base substrate;

S302: fabricating a hole transport layer on a side of the anode layer that is opposite to the base substrate;

S303: fabricating a second interface modification layer on a side of the hole transport layer that is opposite to the base substrate;

S304: fabricating a light emitting layer on a side of the second interface modification layer that is opposite to the base substrate;

S305: fabricating a first interface modification layer on a side of the light emitting layer that is opposite to the base substrate;

S306: fabricating an electron transport layer on a side of the light emitting layer that is opposite to the base substrate; and S307: fabricating a cathode layer on a side of the electron transport layer that is opposite to the base substrate.

The second interface modification layer and the first interface modification layer in the embodiments shown in FIG. 12, FIG. 13 and FIG. 14 each include a quantum dot film or a perovskite polycrystalline film.

It should be noted that, in the embodiments of the present disclosure, the terms "perovskite polycrystalline film" and the "perovskite quantum dot film" refer to two different kinds of materials. The perovskite quantum dots have a strict limitation to size, generally referring to nanoparticles having the particle size from 1 nm to 20 nm, while generally the grain size of the perovskite polycrystalline film is 2 nm to 1000 nm. The perovskite polycrystalline film generally refers to the film obtained by directly spin-coating the precursor, while the perovskite quantum dot film refers to the film that is formed by synthesizing quantum dots firstly through thermal injection, ligand-assisted reprecipitation, and the like, then purifying the quantum dots and dispersing the quantum dots in a non-polar organic solvent, and finally spin-coating the non-polar organic solvent. However, the manufacturing methods for the "perovskite polycrystalline film" and the "perovskite quantum dot film" are not limited to the above-mentioned processes.

In some embodiments, before fabricating the cathode layer, the manufacturing method further includes: fabricating an electrode modification layer on the electron transport layer.

In some embodiments, when the first interface modification layer and/or the second interface modification layer includes $ABX_3$ type quantum dots, the first interface modification layer and/or the second interface modification layer may be fabricated by an ex-situ synthesis method. The ex-situ synthesis method refers to the process in which a certain kind of material may be prepared without the need of adding another one or more element. Based on the above principles, the method for fabricating the second interface modification layer in the embodiment of the present application includes:

preparing a precursor solution containing organic amine cations, divalent metal cations, and halogen anions;

adding the precursor solution into the solution containing an organic ligand, removing the top layer of solution and then centrifuging it to obtain powders containing the perovskite quantum dots;

dissolving the perovskite quantum dots containing powders in a non-polar organic solvent, centrifuging it and taking the supernatant to filter to obtain a perovskite quantum dots containing solution; and spin-coating the obtained perovskite quantum dots containing solution on the hole transport layer.

In specific implementation, the method for fabricating the second interface modification layer may include, for example:

dissolving lead bromide and methylamine bromide in dimethylformamide at a predetermined mass ratio to prepare a precursor solution;

stirring the n-hexane solution while adding dodecylamine, the precursor solution, oleic acid, and acetonitrile, removing the top layer of the solution and then centrifuging it to obtain the powder containing the perovskite quantum dots;

dissolving the perovskite quantum dots containing powders in n-heptane, performing ultrasonic and centrifuging treatment, and then taking the supernatant to filter after the centrifuging to obtain a perovskite quantum dots containing solution;

spin-coating the obtained perovskite quantum dots containing solution on the hole transport layer, and performing annealing process after the spin-coating.

Specifically, the method for fabricating the first interface modification layer may include, for example:

preparing a precursor solution containing organic amine cations, divalent metal cations, and halogen anions;

adding the precursor solution into the solution containing an organic ligand, removing the top layer of solution and then centrifuging it to obtain the powders containing the perovskite quantum dots;

dissolving the perovskite quantum dots containing powders in a non-polar organic solvent, centrifuging it and taking the supernatant to filter to obtain a perovskite quantum dots containing solution;

spin-coating the obtained perovskite quantum dots containing solution on the light emitting layer.

In specific implementation, the method for fabricating the first interface modification layer includes:

dissolving lead bromide and methylamine bromide in dimethylformamide at a predetermined mass ratio to prepare a precursor solution;

stirring the n-hexane solution while adding dodecylamine, the precursor solution, oleic acid, and acetonitrile, removing the top layer of the solution and then centrifuging it to obtain the powders containing the perovskite quantum dots;

dissolving the powders containing the perovskite quantum dots in n-heptane, performing ultrasonic and centrifuging treatment, and then taking the supernatant to filter after the centrifuging to obtain a perovskite quantum dots containing solution; and spin-coating the obtained perovskite quantum dots containing solution on the light emitting layer, and performing annealing process after the spin-coating.

When the first interface modification layer and/or the second interface modification layer is a perovskite polycrystalline film, the first interface modification layer and/or the second interface modification layer in the embodiment of the present disclosure may also be fabricated by an in-situ synthesis method. In contrast to the ex-situ synthesis method, the in-situ synthesis method refers to the process in which another one or more element is needed to be added during the preparation of a certain kind of material, so as to synthesize the kind of material. The difference between the in-situ synthesis method and the ex-situ synthesis method in the embodiments of the present application lies in whether the quantum dots need to be synthesized in advance. In the in-situ synthesis method, the quantum dots are not needed to be synthesized in advance, while in the ex-situ synthesis method the quantum dots are needed to be synthesized in advance. Based on the above principles, the method for fabricating the second interface modification layer in the embodiment of the present disclosure may include, for example:

preparing a precursor solution containing organic amine cations, divalent metal cations, and halogen anions; and spin-coating the precursor solution on the hole transport layer.

As an example, the method for fabricating the first interface modification layer may include, for example:

preparing a precursor solution containing organic amine cations, divalent metal cations, and halogen anions; and spin-coating the precursor solution on the light emitting layer.

In some embodiments, the method for fabricating the second interface modification layer includes:

taking the nanoparticles having a predetermined light-emitting peak and then dissolving the nanoparticles in a non-polar organic solvent to obtain quantum dots containing solution, filtering the obtained quantum dots containing solution and spin-coating it on the hole transport layer, wherein the predetermined light-emitting peak corresponds to the wavelength of 618 nm or 650 nm, and the non-polar organic solvent is, for example, ethanol.

In some embodiments, the solution formed by dissolving the nanoparticles in the non-polar organic solvent is subjected to ultrasonic treatment. The quantum dots containing solution is filtered after being ultrasonic treated. The filtered solution is spin-coated on the hole transport layer and then is subject to an annealing process.

In some embodiments, the method for fabricating the first interface modification layer includes:

taking the nanoparticles having a predetermined light-emitting peak and then dissolving the nanoparticles in a non-polar organic solvent to obtain quantum dots containing solution; filtering the obtained quantum dots containing solution and spin-coating it on the light emitting layer, wherein the predetermined light-emitting peak corresponds to the wavelength of 618 nm or 650 nm, and the non-polar organic solvent is, for example, n-hexane.

In some embodiments, the solution formed by dissolving the nanoparticles in the non-polar organic solvent is subjected to ultrasonic treatment. The quantum dots containing solution is filtered after being ultrasonic treated. The filtered solution is spin-coated on the light emitting layer and then is subjected to an annealing process.

In some embodiments, the method for fabricating the second interface modification layer includes:

taking the nanoparticles having a predetermined light-emitting peak and then dissolving the nanoparticles in n-octane; and applying ultrasonic treatment on the formed solution, wherein the predetermined light-emitting peak corresponds to the wavelength of 618 nm or 650 nm; and filtering the quantum dots containing solution which has been ultrasonic treated, spin-coating the filtered solution on the hole transport layer and then performing an annealing process.

In some embodiments, the method for fabricating the first interface modification layer includes:

taking the nanoparticles having a predetermined light-emitting peak and then dissolving the nanoparticles in n-octane, and applying ultrasonic treatment on the formed solution, wherein the predetermined light-emitting peak corresponds to the wavelength of 618 nm or 650 nm; and filtering the quantum dots containing solution which has been ultrasonic treated, spin-coating the filtered solution on the light emitting layer and then performing an annealing process.

In some embodiments, a method for fabricating a light emitting layer includes: dissolving lead bromide, methylamine bromide and 3,3-diphenylpropylamine in dimethylformamide at a predetermined mass ratio, and stirring the formed solution;

filtering the stirred solution to obtain a precursor solution;

spin-coating the precursor solution on the second interface modification layer or the hole transport layer while adding toluene during the spin-coating process; and performing an annealing process after the spin-coating.

The manufacturing method of the electroluminescent device having only the first interface modification layer in the above embodiments and the electroluminescent device having both the first interface modification layer and the second interface modification layer in the above embodiments will be described in detail below.

Regarding the electroluminescent device having only the first interface modification layer:

Firstly, the preparation of the first interface modification layer is introduced below. In this embodiment, a blue light perovskite (hereinafter referred to as: blue light $MAPbBr_3$) quantum dot film is used as the first interface modification layer. The specific method of fabricating the blue light $MAPbBr_3$ quantum dot film includes the following steps:

Dissolve 0.0734 grams of lead bromide ($PbBr_2$) and 0.0179 grams of methylamine bromide (MABr) in 500 microliters of dimethylformamide (DMF) to form a precursor solution. Take 10 ml of n-hexane into a flask and stir it quickly by a magnetic stirrer. Add 40 microliters of dodecylamine and 0.5 ml of the precursor solution. Then, add 100 microliters of oleic acid slowly to the mixed solution, and finally add 6 ml of acetonitrile as a demulsifier to the system. After removing the top layer of solution and centrifuging at 6000 rpm for 3 minutes, the precipitated powders, i.e., the blue light MAPbBr$_3$ quantum dot powders, are obtained.

Next, the steps for fabricating the first interface modification layer are as follows: dissolving 10 mg of the above-mentioned blue light MAPbBr$_3$ quantum dot powders in 2 ml of n-heptane, and performing an ultrasonic treatment for 10 minutes to ensure that the blue light MAPbBr$_3$ quantum dots are uniformly dispersed in the solvent; subsequently, performing centrifuging at a speed of 5000 rpm for 3 minutes, and after the centrifuging is completed, filtering the supernatant using a 0.22 micron filter head to obtain a clear quantum dots containing solution; finally, taking the above quantum dots containing solution with a pipette to perform a spin-coating process at 2000 rpm for 60 seconds, and then performing an annealing process at 60° C. for 5 minutes.

In this embodiment, a green light MAPbBr$_3$ film is used as the light emitting layer. The specific fabricating method is as follows:

dissolving 0.0734 grams of PbBr$_2$, 0.0179 grams of MABr and 40 mg of 3,3-diphenylpropylamine (DPPA-Br) in 500 microliters of DMF, stirring them at 60° C. for 2 hours, and then filtering by a 0.22 mm filter head to obtain the precursor solution for the subsequent use; finally, taking 100 microliters of the above quantum dots containing solution with a pipette to perform a spin-coating process at 4000 rpm for 60 seconds; once the speed reaches 4000 rpm, adding 250 microliters of toluene; and after the spin-coating is completed, performing an annealing process at 70° C. for 5 minutes so as to obtain a light emitting layer.

In an electroluminescent device having only the first interface modification layer, the anode layer is made of ITO(indium tin oxides), the cathode layer is made of Al, the hole transport layer is made of PEDOT: PS S and TFB, the light emitting layer is made of green light perovskite film, the electron transport layer is made of 1,3,5-tris (1-phenyl-1H-benzimidazol-2-yl) benzene (TPBi), and the electrode modification layer is make of LiF.

The specific preparation steps of the electroluminescent device according to this embodiment are as follows:

Step 1: Pretreatment of anode layer substrate:
1) Cleaning: wipe the corroded ITO conductive glass with absorbent cotton containing detergent, and then rinse it with deionized water; immerse the ITO conductive glass in detergent containing water to be subjected to the ultrasonic treatment for 15 minutes; and immerse the ITO conductive glass in ionized water, acetone, and isopropanol successively for 15 minutes to perform the ultrasonic treatment, with each cleaning step performed twice; finally, immerse the cleaned ITO conductive glass in isopropanol for subsequent use.
2) Plasma treatment: dry the cleaned ITO glass with nitrogen gas and place it face-up in the chamber of the plasma cleaning equipment, and perform the plasma treatment for 5 minutes.

Step 2: Fabrication of the hole transport layer:
Spin-coat PEDOT: PSS on the treated ITO glass, and then perform an annealing process at 150° C. for 15 minutes. After the annealing process, spin-coat TFB (6 mg/ml in chlorobenzene), and then anneal at 130° C. for 30 minutes.

Step 3: Fabrication of the light emitting layer: refer to the above-mentioned fabrication method of the green light MAPbBr3 film, which functions as the light emitting layer.

Step 4: Fabrication of the first interface modification layer: refer to the fabrication method of the first interface modification layer described above.

Step 5: Fabrication of the electron transport layer: deposit a layer of TPBi of 30 nm by a high vacuum vapor deposition equipment, with a deposition rate of 1 (Å/s).

Step 6: fabrication of the electrode: form a layer of LiF of 1 nm by vapor deposition on the electron transport layer at a deposition rate of 0.5 Å/s; and then form a layer of Al of 100 nm by vapor deposition at a deposition rate of 5 Å/s. Finally, an electroluminescent device according to an embodiment of the present application is manufactured.

Regarding the electroluminescent device having both the first interface modification layer and the second interface modification layer in the above embodiment, the specific steps of the manufacturing method are as follows:

Step 1: Fabrication of the interface modification layer.

In this embodiment, a copper indium sulfur (CuInS$_2$)/zinc sulfide (ZnS) quantum dot film is used as the second interface modification layer, and a cadmium selenide (CdSe)/Zinc sulfide (ZnS) quantum dot film is used as the first interface modification layer. The specific fabricating process is as follows:

The second interface modification layer: dissolving 20 mg of nanoparticles having a light-emitting peak at 618 nm in 10 ml of ethanol, and performing an ultrasonic treatment for 10 minutes to ensure the uniform dispersion of quantum dots; filtering by a 0.22 µm filter head to obtain a solution for the subsequent use; finally, taking a 150 microliter of the above solution with a pipette to perform a spin-coating process at a speed of 2500 rpm for 60 seconds; and after the spin-coating, performing an annealing process at 100° C. for 10 minutes to obtain a second interface modification layer.

The first interface modification layer: dissolving 30 mg of nanoparticles having a light-emitting peak at 650 nm in 10 ml of ethanol, and performing an ultrasonic treatment for 15 minutes to ensure the uniform dispersion of quantum dots; filtering it by a 0.22 µm filter head to obtain a quantum dots containing solution for the subsequent use; Finally, 150 microliters of the above solution are spin-coated with a pipette at a speed of 2500 rpm for 60 seconds. After the spin-coating was completed, annealing is performed at 100° C. for 10 minutes to prepare a first interface modification layer.

Step 2: Fabrication of the light emitting layer

In this embodiment, a green light FAPbBr$_3$ film is used as the light emitting layer, where FA represents formamidine. The fabricating method is as follows:

dissolving 0.0734 grams of PbBr$_2$, 0.0179 grams of MABr and 40 mg of DPPA-Br in 500 microliters of DMF, stirring at 60° C. for 2 hours, and then filtering by a 0.22 µm filter head to obtain a precursor solution for the subsequent use; finally, taking 100 microliters of the above solution with a pipette to perform a spin-coating process at 4000 rpm for 60 seconds; once the speed reaches 4000 rpm, adding 250 microliters of toluene immediately; and after the spin-coating is completed, performing an annealing process at 70° C. for 5 minutes.

Step 3: Fabrication of the electroluminescent device.

Similar to the electroluminescent device with only the first interface modification layer, in this embodiment, the anode layer is made of ITO, the cathode layer is made of Al, the hole transport layer is made of PEDOT: PSS and TFB, the light emitting layer is made of green light perovskite film, the electron transport layer is made of 1,3,5-tris (1-phenyl-1H-benzimidazol-2-yl) benzene (TPBi), and the electrode modification layer is made of lithium fluoride (LiF).

The specific preparation steps of fabricating the electroluminescent device having the first interface modification layer and the second interface modification layer in the above embodiment are as follows:

Step 1: Pretreatment of anode layer substrate:
1) Cleaning: wipe the corroded ITO conductive glass with absorbent cotton containing detergent, and then rinse it with deionized water; immerse the ITO conductive glass in detergent containing water to be subjected to the ultrasonic treatment for 15 minutes; and immerse the ITO conductive glass in ionized water, acetone, and isopropanol in sequence for 15 minutes to perform the ultrasonic treatment, with each cleaning step performed twice; finally, immerse the cleaned ITO conductive glass in isopropanol for subsequent use.
2) Plasma treatment: dry the cleaned ITO glass with nitrogen gas and place it face-up in the chamber of the plasma cleaning equipment, and perform the plasma treatment for 5 minutes.

Step 2: Fabrication of the hole transport layer:
Spin-coat PEDOT: PSS on the treated ITO glass, and then perform an annealing process at 150° C. for 15 minutes. After the annealing process, spin-coat TFB (6 mg/ml in chlorobenzene), and then anneal at 130° C. for 30 minutes.

Step 3: Fabrication of the second interface modification layer: refer to the fabrication of the second interface modification layer in Step 1 mentioned above.

Step 4: Fabrication of the light emitting layer: refer to the fabrication of the light emitting layer in the Step 2 mentioned above.

Step 5: Fabrication of the first interface modification layer: refer to the fabrication of the first interface modification layer in Step 1 mentioned above.

Step 6: Fabrication of the electron transport layer: deposit a layer of TPBi of 30 nm by a high vacuum vapor deposition equipment, with a deposition rate of 1 (Å/s).

Step 7: Fabrication of the electrode: form a layer of LiF of 1 nm by vapor deposition on the electron transport layer at a deposition rate of 5 Å/s; and then form a layer of Al of 100 nm by vapor deposition at a deposition rate of 5 Å/s. Finally, an electroluminescent device according to the third embodiment of the present application is manufactured.

The beneficial effects obtained by applying the embodiments of the present disclosure include:

In the embodiment of the present application, an interface modification layer is added between the light emitting layer and the electron transport layer and/or between the light emitting layer and the hole transport layer. Since the energy level of the first interface modification layer matches the energy level of the hole transport layer and the energy level of the light emitting layer and the energy level of the second interface modification layer matches the energy level of the electron transport layer and the energy level of the light emitting layer, the electron and/or hole injection barrier can be reduced, thereby reducing the turn-on voltage of the device and improving the device efficiency.

The above description is only part of the embodiments of the present disclosure. It is noted that, those skilled in the art could make improvements and modifications, which should be considered to fall within the scope of the present disclosure, without departing from the principle in the present disclosure.

What is claimed is:

1. An electroluminescent device, comprising an anode layer, a light emitting layer, a cathode layer, a hole transport layer between the anode layer and the light emitting layer, and an electron transport layer between the cathode layer and the light emitting layer, wherein the electroluminescent device further comprises:
a first interface modification layer between the light emitting layer and one of the hole transport layer and the electron transport layer;
wherein an energy level of the first interface modification layer matches an energy level of the light emitting layer and an energy level of the one of the hole transport layer and the electron transport layer.

2. The electroluminescent device according to claim 1, wherein the electroluminescent device further comprises: a second interface modification layer between the light emitting layer and the other one of the hole transport layer and the electron transport layer;
wherein an energy level of the second interface modification layer matches an energy level of the light emitting layer and an energy level of the other one of the hole transport layer and the electron transport layer.

3. The electroluminescent device according to claim 2, wherein, the first interface modification layer is located between the electron transport layer and the light emitting layer, and the lowest unoccupied molecular orbital energy level of the first interface modification layer is between the lowest unoccupied molecular orbital energy level of the electron transport layer and the lowest unoccupied molecular orbital energy level of the light emitting layer; and the second interface modification layer is located between the hole transport layer and the light emitting layer, and the highest occupied molecular orbital energy level of the second interface modification layer is between the highest occupied molecular orbital energy level of the hole transport layer and the highest occupied molecular orbital energy level of the light emitting layer.

4. The electroluminescent device according to claim 3, wherein, the hole transport layer comprises a first hole transport layer and a second hole transport layer; the first hole transport layer is located between the second hole transport layer and the anode layer; the first hole transport layer is made of a mixture of a poly 3,4-ethylenedioxythiophene monomer and a polystyrene sulfonate; the second hole transport layer is made of TFB; the first interface modification layer comprises quantum dots composed of cadmium selenide and zinc sulfide; the second interface modification layer comprises quantum dots composed of copper indium sulfur and zinc sulfide; the anode layer is made of indium tin oxide; the light emitting layer is made of green light perovskite film; the electron transport layer is made of TPBi; and the cathode layer is made of Al.

5. The electroluminescent device according to claim 3, wherein the highest occupied molecular orbital energy level of the first interface modification layer is between the highest occupied molecular orbital energy level of the electron transport layer and the highest occupied molecular orbital energy level of the light emitting layer; and the lowest unoccupied molecular orbital energy level of the second interface modification layer is between the lowest unoccupied molecular orbital energy level of the hole transport layer and the lowest unoccupied molecular orbital energy level of the light emitting layer.

6. The electroluminescent device according to claim 2, wherein,
the first interface modification layer comprises a quantum dot film or a perovskite polycrystalline film; and
the second interface modification layer comprises a quantum dot film or a perovskite polycrystalline film.

7. The electroluminescent device according to claim 6, wherein, quantum dots in the quantum dot film have a size between 2 nm and 20 nm; crystalline grains in the perovskite polycrystalline film have a size of 2 nm to 1000 nm.

8. The electroluminescent device according to claim 6, wherein the quantum dot film comprises at least one of the following quantum dots:
quantum dots composed of Group II elements and Group VI elements;
quantum dots composed of Group III elements and Group V elements;
quantum dots composed of Group I elements, Group III elements, and Group V elements;
quantum dots composed of Group I elements, Group III elements, and Group VI elements; or
quantum dots composed of Group II elements, Group IV elements and Group VI elements.

9. The electroluminescent device according to claim 6, wherein the quantum dot film comprises ABX3 type quantum dots, wherein A is an organic amine cation, B is a divalent metal cation, and X is a halogen anion.

10. The electroluminescent device according to claim 2, wherein, the first interface modification layer comprises quantum dots composed of copper indium sulfur and zinc sulfide, or quantum dots composed of cadmium selenide and zinc sulfide; and
the second interface modification layer comprises quantum dots composed of copper indium sulfur and zinc sulfide, or quantum dots composed of cadmium selenide and zinc sulfide.

11. The electroluminescent device according to claim 2, wherein each of the first interface modification layer and the second interface modification layer has thickness between 10 nm and 1000 nm.

12. The electroluminescent device according to claim 1, wherein, the first interface modification layer is located between the electron transport layer and the light emitting layer, and the lowest unoccupied molecular orbital energy level of the first interface modification layer is between the lowest unoccupied molecular orbital energy level of the electron transport layer and the lowest unoccupied molecular orbital energy level of the light emitting layer,
wherein, the hole transport layer includes a first hole transport layer and a second hole transport layer; the first hole transport layer is located between the second hole transport layer and the anode layer; the first hole transport layer is made of a mixture of a poly 3,4-ethylenedioxythiophene monomer and a polystyrene sulfonate; the second hole transport layer is made of TFB; the first interface modification layer comprises blue light perovskite quantum dots; the anode layer is made of indium tin oxide; the light emitting layer comprises green light perovskite quantum dots; the electron transport layer is made of TPBi; and the cathode layer is made of Al.

13. The electroluminescent device according to claim 1, further comprising an electrode modification layer which is located between the electron transport layer and the cathode layer.

14. The electroluminescent device according to claim 13, wherein the electrode modification layer comprises lithium fluoride and a thickness of the electrode modification layer is between 1 nm and 10 nm.

15. A display apparatus comprising the electroluminescent device according to claim 1.

16. A manufacturing method for an electroluminescent device, the manufacturing method comprising:
fabricating an anode layer on a base substrate;
fabricating a hole transport layer on a side of the anode layer that is opposite to the base substrate;
fabricating a light emitting layer on a side of the hole transport layer that is opposite to the base substrate;
fabricating an electron transport layer on a side of the light emitting layer that is opposite to the base substrate; and
fabricating a cathode layer on a side of the electron transport layer that is opposite to the base substrate,
wherein, the method further comprises:
after fabricating the hole transport layer and before fabricating the light emitting layer, forming a second interface modification layer on a side of the hole transport layer that is opposite to the base substrate, and an energy level of the second interface modification layer matches an energy level of the hole transport layer and an energy level of the light emitting layer; and/or
after fabricating the light emitting layer and before fabricating the electron transport layer, forming a first interface modification layer on a side of the light emitting layer that is opposite to the base substrate, and an energy level of the first interface modification layer matches an energy level of the electron transport layer and an energy level of the light emitting layer.

17. The manufacturing method according to claim 16, wherein the first interface modification layer comprises a quantum dot film or a perovskite polycrystalline film;
the second interface modification layer comprises a quantum dot film or a perovskite polycrystalline film.

18. The manufacturing method according to claim 17, wherein forming a second interface modification layer on a side of the hole transport layer that is opposite to the base substrate comprises:
preparing a precursor solution containing an organic amine cations, divalent metal cations, and halogen anions;
adding the precursor solution into a solution containing an organic ligand, removing a top layer of solution and then centrifuging the solution to obtain perovskite quantum dots containing powders;
dissolving the perovskite quantum dots containing powders in a non-polar organic solvent, centrifuging the solvent in which the perovskite quantum dots containing powders are dissolved and taking supernatant to filter so as to obtain a perovskite quantum dots containing solution; and
spin-coating the obtained perovskite quantum dots containing solution on the hole transport layer; and/or
wherein, forming a first interface modification layer on a side of the light emitting layer that is opposite to the base substrate comprises:
preparing a precursor solution containing organic amine cations, divalent metal cations, and halogen anions;
adding the precursor solution into a solution containing an organic ligand, removing a top layer of solution and then centrifuging the solution to obtain perovskite quantum dots containing powders;
dissolving the perovskite quantum dots containing powders in a non-polar organic solvent, centrifuging the solvent in which the perovskite quantum dots containing powders are dissolved and taking supernatant to filter so as to obtain a perovskite quantum dots containing solution; and spin-coating the obtained perovskite quantum dots containing solution on the light emitting layer.

19. The manufacturing method according to claim 17, wherein forming a second interface modification layer on a side of the hole transport layer that is opposite to the base substrate comprises:

preparing a precursor solution containing organic amine cations, divalent metal cations, and halogen anions; and spin-coating the precursor solution on the hole transport layer; and/or wherein, forming a first interface modification layer on a side of the light emitting layer that is opposite to the base substrate comprises:

preparing a precursor solution containing organic amine cations, divalent metal cations, and halogen anions; and spin-coating the precursor solution on the light emitting layer.

20. The manufacturing method according to claim 17, wherein forming a second interface modification layer on a side of the hole transport layer that is opposite to the base substrate comprises:

taking nanoparticles having a predetermined light-emitting peak and then dissolving the nanoparticles in a non-polar organic solvent to obtain a quantum dots containing solution; and filtering the obtained quantum dots containing solution and spin-coating it on the hole transport layer; and/or wherein, forming a first interface modification layer on a side of the light emitting layer that is opposite to the base substrate comprises:

taking nanoparticles having a predetermined light-emitting peak and then dissolving the nanoparticles in a non-polar organic solvent to obtain a quantum dots containing solution; and filtering the obtained quantum dots containing solution and spin-coating it on the light emitting layer.

* * * * *